Figure 1:
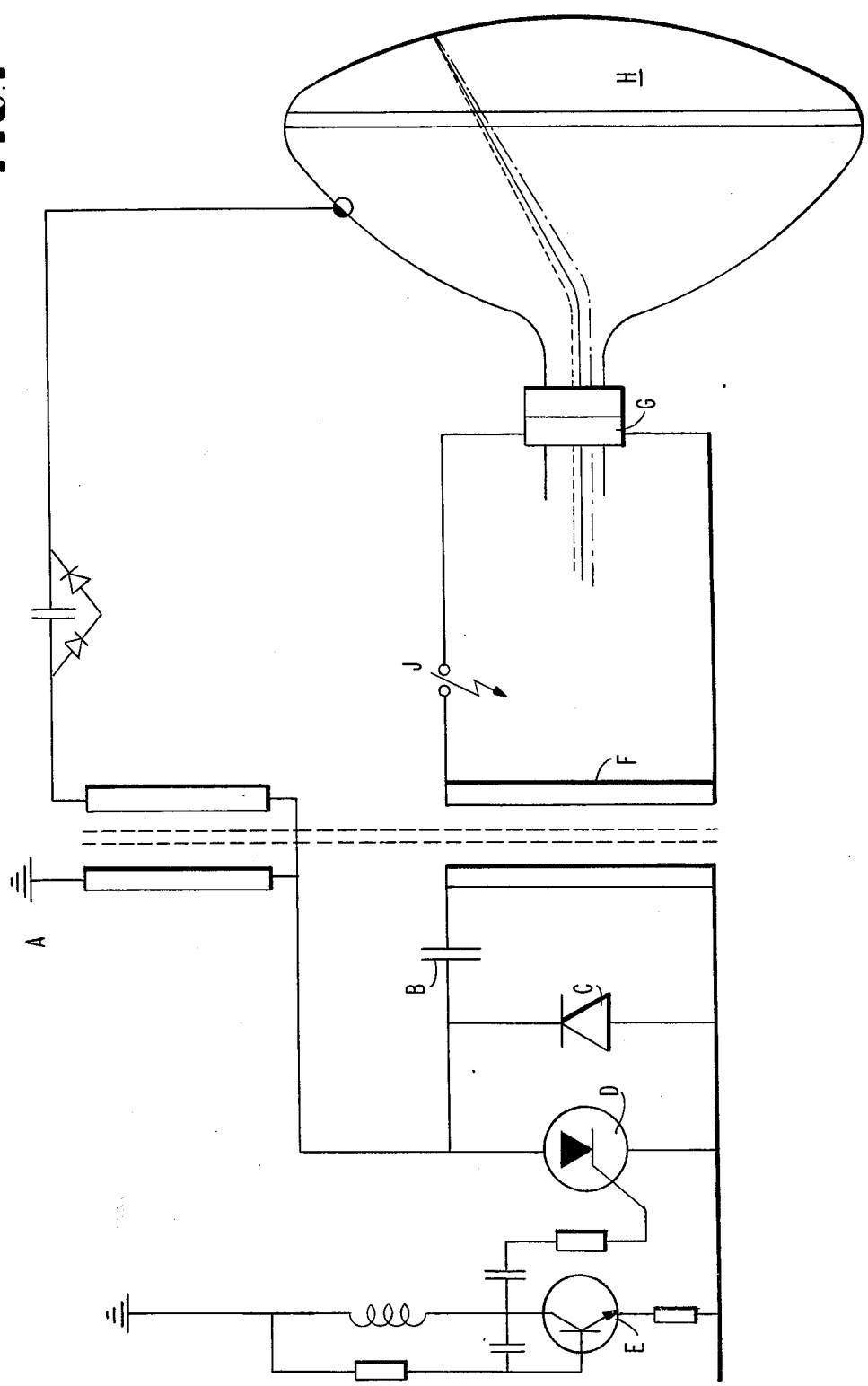

United States Patent [19]

Franz et al.

[11] 4,031,313
[45] June 21, 1977

[54] PRINTED CIRCUITS WITH ARC-RETARDANCE

[75] Inventors: Arnold Franz, Troisdorf-Spich; Dirk Huthwelker, Troisdorf-Oberlar; Lothar Jacob, Eckhausen, all of Germany

[73] Assignee: Dynamit Nobel Aktiengesellschaft, Germany

[22] Filed: Feb. 3, 1975

[21] Appl. No.: 546,810

[30] Foreign Application Priority Data

Feb. 1, 1974 Germany .......................... 2404777
July 1, 1974 Germany .......................... 2431447

[52] U.S. Cl. .......................... 174/68.5; 428/209; 428/215; 428/336; 428/411; 428/460; 428/463; 428/436; 428/442; 428/415; 428/416; 428/418; 428/522; 428/526; 428/530; 428/531; 428/901; 428/920
[51] Int. Cl.² .................... H05K 1/00; B32B 15/02
[58] Field of Search .......... 428/901, 460, 209, 215, 428/411, 463, 415, 416, 418, 273, 920, 436, 442, 522, 526, 530, 531, 336; 174/68.5

[56] References Cited

UNITED STATES PATENTS

| | | | |
|---|---|---|---|
| 2,721,153 | 10/1955 | Hopf | 428/901 |
| 3,090,706 | 5/1963 | Cado | 428/901 |
| 3,240,662 | 3/1966 | Smyers | 428/457 |
| 3,477,900 | 11/1969 | Soukup | 428/901 |
| 3,558,423 | 1/1971 | Rossetti | 428/901 |
| 3,770,572 | 11/1973 | Henry | 428/462 |
| 3,809,603 | 5/1974 | Kooi | 428/457 |
| 3,892,903 | 7/1975 | Dowbenko | 428/460 |

*Primary Examiner*—Ellis Robinson
*Attorney, Agent, or Firm*—Craig & Antonelli

[57] ABSTRACT

A laminated material comprises a substrate material containing resin-impregnated layers, a metal foil disposed on said substrate and an arc-retardant layer arranged between the metal foil and the substrate material. The arc-retardant layer is an arc-retardant, cross-linked heat-stable synthetic resinous material consisting of from about 60 to 100% by weight of a heat-stable resin which is free of aromatic groupings or heterocyclic rings containing at least one heteroatom and conjugated double bonds and which is not converted to a graphite-containing structure upon being thermally decomposed.

9 Claims, 2 Drawing Figures

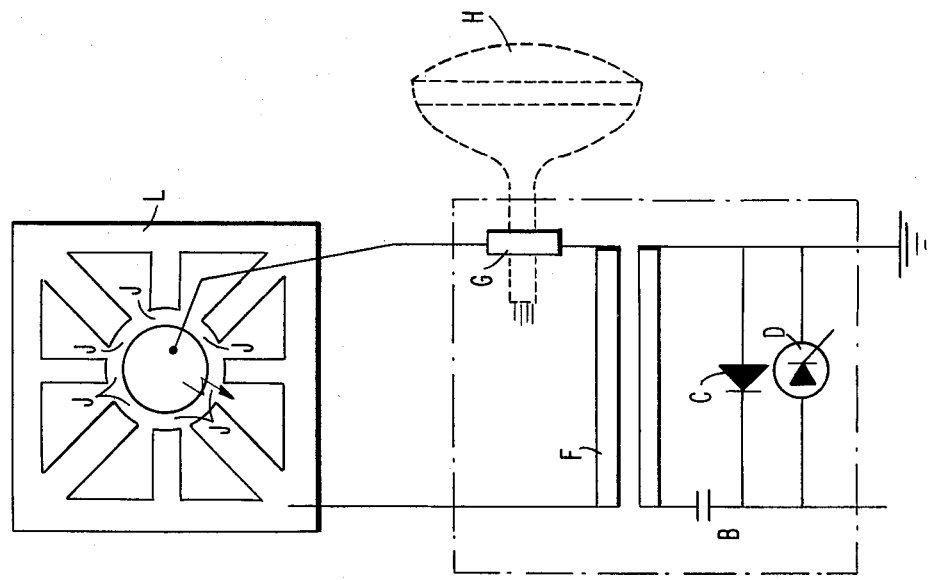
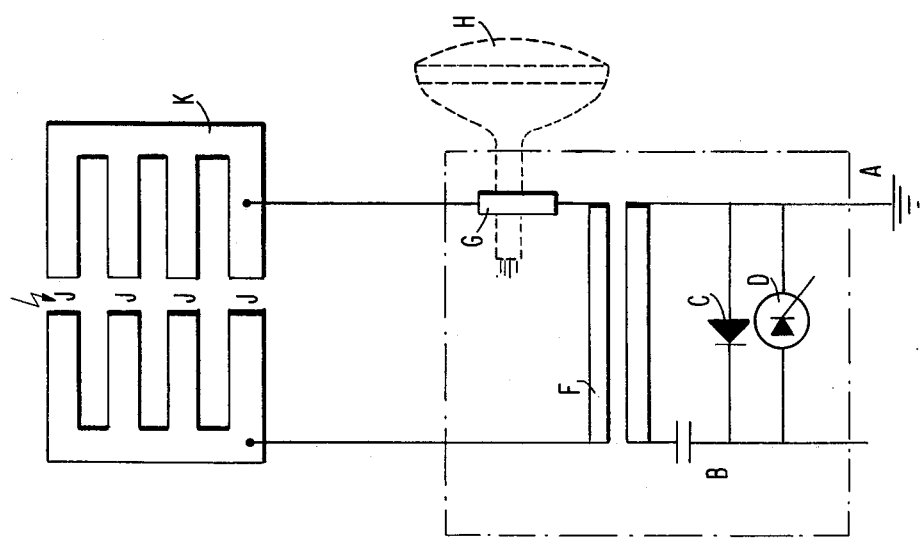
FIG.2

PRINTED CIRCUITS WITH ARC-RETARDANCE

The present invention relates to the production of printed circuits which are arc-retardant even upon the application of high voltages.

Printed circuits are utilized as the wiring elements in many electric appliances. These printed circuits additionally take over the mechanical fastening of various electrical components. Such printed circuits consist of laminates as the substrate material, on which is laminated on one or both sides a metallic foil, preferably a copper foil.

The laminates contain, as the reinforcement, cellulose in the form of paper, e.g. panels, monofilaments, or fiber layers or synthetic polymeric compounds, such as polyesters or polyamides in the form of synthetic papers or sheets or fiber layers. Besides, the reinforcements can consist of spun glass fibers in the form of fabrics, nonwoven sheets, or mats. The respective reinforcing materials are first impregnated in conventional resin solutions having a basis of phenolic resins, epoxy resins, or other thermosetting resins.

The substrate material is ordinarily built up of one or a plurality of superimposed layers to build up a laminate and can be cladded in the same operation on one or both sides with a metallic foil, preferably a copper foil. The metallic foil can be coated, to obtain an improved bond, with a hot-melt adhesive on the side facing the laminate, prior to a pressing step.

The composite material is subsequently cured in a hot press according to a conventional process with the use of heat and pressure, whereby the individual layers of the substrate are bonded to form a solid laminate, and the metallic foil is firmly attached to the laminate. This basic material serves for the manufacture of printed circuits.

In addition to circuit boards laminated on one or both sides, multilayer circuits are also utilized, wherein first several individual printed circuit boards are produced and then the latter are laminated together with the aid of uncured prepregs to form a multilayer circuit.

During the manufacture of printed circuits, metal foil conductors are formed in accordance with the desired circuit pattern, with a specific conductor width and a thickness of 5–200μ, depending on the thickness of the metallic foil employed. Already during the production of the printed circuit board, hairline cracks can occur due to bending stresses, for example during punching, which interrupt the conductor path. Such hairline cracks can also be produced by a breakage of the printed circuit boards during transportation and handling. Such a hairline crack can cause an interruption in the respective circuit, wherein the conductor ends can have an only very minor distance from each other in the range of from 5 to 100 μm. Such an interruption of the circuit can also occur if an electrical component is not satisfactorily soldered to the circuit board. At this cold solder connection (cold joint), interruptions are likewise encountered, wherein the respective conductor ends have a small distance from each other.

The above-described interruptions often cannot be clearly detected, because the conductor ends will be in contact with each other in case of a cold appliance or in a certain position, and the interruption occurs only during warmup, when the ends are being touched, or when the position of the ends is altered, for example by vibrations. This interruption entails the following grave disadvantage.

Let us assume that a functional circuit is interrupted only by one of the above-described causes. Consequently, current is cut off to zero, and the entire no-load voltage of the system is present at the point of interruption. Depending on the magnitude of the voltage and the spacing at the point of interruption, an arc is produced at that point, generating temperatures of several thousand degrees centigrade. The intensity of the arc depends on the voltage per se, as well as on the possible amperage.

The processes taking place during such a current interruption can be well demonstrated with the aid of a tube or a thyristor-controlled horizontal deflection circuit of a color television set, because the pulse voltage present therein, of about 1,400 volts (maximal 2000 to 3000 volt peak) with a deflection current of about 0.2 amperes at a frequency of 15.62 kHz (kilocycles per second) offers especially good conditions for the formation of an arc and for the ignition of the basic materials forming the printed circuits. The deleterious consequences connected with such circuits can be better recognized in this way. One circuit of this type, which will be described in greater detail, is shown in FIG. 1.

This invention will be further understood from the following detailed description, including a description of the problems of the prior art devices and the accompanying drawings wherein:

FIG. 1 is a circuit diagram of a horizontal deflection stage in a television apparatus with thyristor output; and FIGS. 2a and 2b illustrate the use of the test electrodes in the horizontal deflection circuit of the television apparatus shown in FIG. 1.

The voltage produced at the gap of the test electrode causes an arc which, due to its high temperatures, thermally decomposes the printed circuit materials impregnated with the thermoset. Ether or methylene bridges of the phenolic or epoxy resins based on bisphenol A, i.e. p,p'-isopropylidenediphenol, can then be split off, so that the proportion of aromatic C:C bonds in the resins is increased. This, finally, leads to graphite-like structures, so that the insulation resistance of $10^{12}$ ohms of the material is lowered to a few 10 ohms. The site of the flaw immediately bursts into flame, and the low resistance of the burning site takes care of maintaining the current flow. If the appliance is turned off, the damaged site continues to burn in dependence on the flame resistance of the laminate.

Furthermore, an observation of the ignition process shows that the thin copper foil of, for example 35μ, as customary for the manufacture of printed circuits, is vaporized due to the high arc temperature. Accordingly, the spacing between the conductor ends, which originally amounted to merely a few microns, is constantly being enlarged by the melting of the foil conductor. The arc would automatically cease to exist due to the constantly growing distance, if the voltage and power present in the system can no longer maintain the arc across the large damaged site. However, such arc extinguishment is prevented by the fact that the hot-melt adhesive and/or the binder resin are converted in the arc to a graphite-like structure. Accordingly, the synthetic resin combusted underneath the melting copper foil replaces the foil conductor, due to its good conductivity, and constantly bridges the electrode spacing.

The exact causes of fires with printed circuits have not been known heretofore, since the above-mentioned testing method has been unknown thus far. For judging the arc retardance characteristic of insulating materials, only the following testing methods have previously been employed, but these methods simulate the practical conditions of the ignition of a printed circuit board only with limitations:

1. tracking resistance according to DIN (German Industrial Standard) 53 480 or IEC 112 (International Electrotechnical Commission, U.S. National Committee);
2. high-voltage arc test UL 492; and
3. high-current arc test UL 492 (Underwriter Laboratories Subject).

In the tracking resistance test, electrodes of 2 × 5mm. are employed, disposed on the specimen at a spacing of 4 mm. under an angle of 60°. In the cut-off voltage method, 50 drops of a test fluid are dropped at intervals of 30 seconds between the electrodes in the laminate. In this method, the voltage is determined at which 50 drops can be placed on the laminate without there being a tracking or leakage current of $I = 0.5$ ampere.

The high-voltage arc testing method UL 492 (high voltage arc ignition) uses steel electrodes having diameter of 3.2mm. at a spacing of 4mm., lying at an angle of 45° on the laminate. The electrodes are under a voltage of 5,200 volts (a.c. 50 Hz). The time is measured which elapses to ignition.

In the high-current arc testing procedure UL 492 (high current arc ignition), a solid copper electrode is utilized having a chisel-type tip and a movable tungsten electrode having a pyramidal tip. Both electrodes have a diameter of 3.2mm. and are disposed on the laminate at an angle of 45°. The electrodes are opened at an interval of 1.5 seconds, so that an arc is produced due to the voltage of 240 volts and a short-circuit current of 3 amperes. The number of arcs up to ignition (flame eruption) is counted.

The aforementioned tests only render a conditional indication when evaluating the flammability characteristic of a printed circuit board. The most essential difference resides in the dimensions and arrangement of the electrodes. While the thin foil conductors on a printed circuit board can be dissipated by melting, the electrodes in the above-described testing methods are of much larger dimensions and furthermore consist of a material which prevents melting, whereby different effects are introduced.

The heretofore conducted measures for reducing the flammability of printed circuits are based on making the basic material of the individual laminates more flame-retardant by the addition of conventional flame-proofing agents, such as, for example pentabromodiphenyl ether. The thus-modified laminates, in this case, do fulfill the conditions which they must meet according to DIN 53 480 and the UL testing method 492. They also offer the passive protection that the appliance fire is limited in its consequent damage, because the material has only a low flame propagation and because only a brief afterburning period exists after the arc has been extinguished, for example by cutting off the voltage to the appliance. However, such laminates do not prevent an arc produced at a flaw site of the conductor from recurring. After the current has been cut off and then turned on again, another arc is formed with the aforedescribed disadvantages.

Accordingly there has been the problem of producing printed circuits wherein an arc produced after the application of voltage at any possibly present flaw sites of the conductor does not form carbon bridges of a graphite-like structure which could maintain the arc. Rather, the object is to prevent the formation of such graphite-type carbon bridges, so that a possibly produced arc will be cut off and the substrate material is not ignited thereby.

In order to attain this object a laminated material has now been found which is characterized in that an arc-retardant resistant layer is arranged between the metallic foil and the substrate material, this layer being a heat-stable synthetic resin consisting of 60–100% by weight of cross-linked aliphatic or cycloaliphatic resins without aromatic groupings or heterocyclic rings containing at least one hetero-atom and conjugated double bonds. This arc-retardant layer is to have a minimum thickness of $20\mu$. The maximum thickness depends on the type and design of the synthetic resins employed. This thickness can be up to $300\mu$. The preferred range for the thickness of the arc-retardant layer ranges between 30 and $100\mu$. Depending on the composition of the layer, this arc-retardant layer can also preferably serve as an adhesive to bond the metallic foil to the substrate material.

The laminated materials of this invention fulfill the conditions they are supposed to meet. The damaged site in the electric conductor does not become electrically conductive during the vaporization of the foil conductor in the arc, but rather retains a high insulation resistance of more than $10^{12}$ ohms. This is the prerequisite for the arc-retardant laminate of this invention. In such an arc-retardant laminate, the current is likewise interrupted in case of damage, and the thus-produced arc does vaporize the foil conductors, which are thus melted, just as in the case of a laminate without arc retardance. However, in this case, the electrode spacing is increased until the voltage and power are no longer sufficient to maintain the arc. This vaporization process, including the cessation of the arc, takes place so rapidly that the laminate cannot burst into flame. The damaged site has cut itself off on its own. When the appliance is turned back on, the arc is no longer reignited, because the electrode spacing has become too large. Such a material according to the present invention offers active safety against arc-produced ignition.

Suitable components of the arc-retardant layer are acrylic resins having a basis of acrylonitrile, methacrylonitrile or acrylic acid esters (e.g. methyl and ethyl esters), or ketone resins under the condition that these resins can be crosslinked with themselves or with other additional curable resins, e.g. phenolic, epoxy resins. Since the flame-resistant layer, after curing, is to possess, if at all possible, the same thermal and mechanical properties as the resin utilized for the impregnation of the laminates, it is advantageous to blend the synthetic resin used for this purpose with a hardenable resin, e.g. phenolic or epoxy resin. The proportion of these phenolic or epoxy resins in the arc-retarding layer, however, is not to exceed 30% by weight, because otherwise the effect of this invention does not occur any more. Preferably, this proportion ranges between 10 and 20% by weight, based on the total weight of the arc-retardant layer.

If the arc-retardant layer consists of acrylic resins, especially good results can be attained if the composition is made up of acrylonitrile in amounts of 20–70% by weight, acrylic acid esters in amounts of between 20 and 70% by weight, and a phenol-resol resin or an epoxy resin on the basis of bisphenol A in amounts of 15–20% by weight. Acrylic acid esters are understood to mean preferably the methyl ester and the ethyl ester of acrylic acid.

As the flame-resistant layer having a basis of ketone resins, a composition is suitable preferably which contains the ketone resin in amounts of between 70 and 90% by weight and additionally epoxy resins on the basis of bisphenol A and/or phenol-resol resins, respectively in quantities of between 10 and 20% by weight. The term "ketone resins" is understood to mean resins produced by the alkaline condensation of formaldehyde with aliphatic (e.g. acetone, methyl-ethyl-ketone) and/or cycloaliphatic ketones (e.g. cyclohexanone, methylcyclohexanone).

Essential major constituents of the arc-retardant layers embodying this invention are cross-linked thermosetting synthetic resins and cross-linkable elastomers, which contain no aromatic groups and no heterocyclic rings containing conjugated double bonds (e.g. melamine). In principle, any polymer meeting these requirements can be used since it has been found that when aromatic compounds and/or the heterocyclic compounds of the aforesaid type are heated in an arc, they are decomposed to the aforementioned graphite-like carbon bridges having the disadvantages referred to. However, if these compounds are present in a resin to be used in proportions which do not exceed 30% by weight, preferably not more than 15% by weight, the aforesaid disadvantages do not arise. Since the cured arc-retardant layer, should, as far as possible have the same thermal and mechanical properties as the resin used in the formation of the support for the metal foil, the synthetic plastics material used for the production of the arc-retardant material is preferably mixed with a thermosetting resin of the type used to produce the support for the metal foil, for example a phenolic or epoxide resin or even a melamine resin. The proportion of these aromatic or heterocyclic ring-containing resins in the ignition-inhibiting layer should however not exceed 30% by weight, because otherwise the effect according to the invention no longer occurs. The amount is preferably from 10 to 20% by weight of the ignition-inhibiting layer.

Thermosetting synthetic resins which can be employed in the production of arc-retardant layers embodying this invention are cycloaliphatic epoxide resins, which by definition contain in the molecule one or more cycloaliphatic rings and aliphatic radicals and are, by definition, free from aromatic groups, in particular. These cycloaliphatic resins include resins which are built up from cycloaliphatic rings having epoxide oxygen bonded to the latter (e.g. dicyclopentadiene dioxide) and resins which are built up on cycloaliphatic compounds, with which the epoxide oxygen is bonded to an aliphatic side chain, as in for example, diglycidyl esters of hexahydrophthalic acid. The epoxide oxygen can in addition be arranged in the starting compounds, both on a ring and on a side chain, as in, for example, vinyl cyclohexane dioxide. The production and hardening of these resins may be effected by conventional methods. Hardeners for the resins are generally aliphatic carboxylic acids or anhydrides thereof, although boron trifluoride or its addition compounds with aliphatic amines can also be used.

Other classes of thermosetting synthetic resin which can be employed as the main component of an ignition-inhibiting layer embodying this invention are aliphatic unsaturated polyesters, urea-formaldehyde resins and polyurethane resins, provided that the isocyanate and the alcohol components of the polyurethane are not aromatic or heterocyclic compounds. Examples of these unsaturated polyesters are condensation products of $\alpha,\beta$-unsaturated aliphatic dicarboxylic acids or their anhydrides (e.g. maleic anhydride, maleic acid, fumaric acid, itaconic acid and mesaconic acid) or saturated aliphatic dicarboxylic acids or their anhydrides (e.g succinic anhydride, adipic acid, sebacic acid, dodecanedicarboxylic acid and dimethylmalonic acid), with aliphatic diol or a butane diol. Ether alcohols, as for example glycerol monoalkyl ethers, diethylene glycol or triethylene glycol, can also be used as diol starting compounds for such polyesters.

When a polyurethane resin is used in the production of an ignition-inhibiting layer embodying this invention, it may be produced using for example 1,6-hexamethylene diisocyanate as isocyanate component. The aforementioned unsaturated polyesters can for example be used as alcohol component. However, aliphatic polyethers and other aliphatic polyhydroxy compounds can also be used as hydroxy-terminated component required for the production of the polyurethane resin.

Elastomers which can be employed in the production of ignition-inhibiting layers embodying this invention include polymers of conjugated dienes, for example polybutadienes and methyl substitution products thereof and blends thereof with acrylic resins, and copolymers of acrylic compounds and conjugated dienes. Other cross-linkable elastomers which can be used are polyepichlorohydrin(CHR) and chlorohydrin polymers (copolymers of epichlorohydrin with ethylene oxide, known as CHC synthetic plastics). With the last mentioned classes of elastomer, cross-linking is effected either by means of amines or metal oxides.

Silicones can also be used as the major material for formation of an ignition-inhibiting layer, provided they have a resin-like character and are capable of being cross-linked. The silicone resins may be used together with acrylic resins and/or known adhesion promoters, in order to enable them to match the thermal and mechanical properties of the resins from which the support for the metal foil is made or in order to improve the adhesion of the silicone resins with the metal foil. Organo-functional silanes or organophosphonic acid esters can also be used as adhesion promoters for this purpose.

The metallic foil is preferably a copper foil, but it is also possible to use foils of other metals having a satisfactory electrical conductivity, such as aluminum, silver, or tin. The thickness of the foil can vary within wide regions; preferably, a maximally thin foil is used having a thickness of between 5 and 100$\mu$.

The metallic foil and the substrate material can be bonded in various ways. It is possible to apply the arc-retardant layer to the metallic foils as well as to the uppermost layer of the substrate material and then to produce the bond by heating under pressure. If the arc-retardant layer is applied to the substrate material, it is also possible to effect the metal-coating step in accordance with known processes first chemically and then galvanically. However, it is also possible to produce a thin sheet of the arc-retardant layer and insert same between the metallic foil and the substrate material, thereafter establishing the bond by hot pressing.

It is furthermore likewise possible to coat or impregnate the reinforcing material of the uppermost laminate layer, which is to be bonded to the metallic foil, in place of a binder resin with a solution or dispersion of the arc-retardant synthetic resin, and to utilize this impregnated layer material as the adhesive coat.

The substrate material employed for the production of printed circuits consists of conventional laminated sheets, each of which consist of respectively a reinforcing material and a binder resin.

Suitable reinforcing materials are flat (large-area) fiber materials on the basis of natural or synthetic organic fibers.

Suitable reinforcements can be, in particular, paper materials such as cotton papers, preferably cotton-linters papers, but also those of sulfate pulp or sulfite pulp, obtained from conifers; however, the flat fiber materials can also consist of nonwovens, layers, mats, or fabrics, produced from wood pulp, fibers, or strips of synthetic fibers, such as polyesters, polyamides, or other polymeric organic substances. These organic substances can be entirely or partially replaced by fibrous mineral substances, such as glass fibers, spun glass fibers, glass fleeces (mats), mineral wood (rock wool), asbestos fibers.

Suitable binder resins are curable (i.e. hardenable) resins, such as, for example, epoxy, phenolic, melamine, polyester, or silicone resins, as they are customary for the production of industrial laminated materials. Other materials for reinforcements and binders are described in the U.S. applications, Ser. Nos. 422,938, abandoned and 283,247 now U.S. Patent No. 3,922,459. The respective reinforcing substances of the individual layers are impregnated with the binder resin according to conventional methods, and then dried as desired while the resin is preliminarily polymerized. Thereafter, several of the layers are placed on top of one another, together with the metallic foil as the uppermost layer, and cured into laminates with the use of heat and pressure, e.g. 140 to 180° C. and 30 to 150 bar.

EXAMPLES 1 and 2

A copper foil, supplied as a roll, having a width of 1,100 mm. and a weight per unit area of 305 g./m², corresponding to a thickness of 35 $\mu$, is coated by means of a scraper (doctor blade) with, respectively, a synthetic resin solution having the following composition:

| EXAMPLE 1 | EXAMPLE 2 |
| --- | --- |
| Synthetic Resin Solution A | Synthetic Resin Solution B |
| 80 parts phenol-resol resin | 85 parts of BASF-product Acronal 12DE, consisting essentially of a major part of acrylonitrile and a minor part of acrylic acid ester |
| 20 parts epoxy resin 828 Shell | 15 parts phenolic resin |
| 5 parts curing agent diamino-diphenylmethane | 50 parts methanol |
| 50 parts acetone | |

The solutions each have a viscosity of about 500–600 centipoises. The copper strip is conducted through a drying duct wherein it is heated within 5 minutes at a temperature rising from 100° C. to 140° C., in order to remove the solvents. After exit from the dryer, the foil has obtained a coat of 40 g./m². A thus-coated copper foil is heated, together with eight layers of a phenolic resin impregnated paper, between press plates under a hot press for 70 minutes under a pressure of 80 bars and a temperature of 170° C. A copper-laminated hard paper panel of a thickness of 1.6 mm. was thus produced.

EXAMPLE 3

Analogously to Example 2, a phenolic resin core paper, as customarily used for the production of phenolic laminates is coated with the synthetic resin solution B. The coating step and the drying step were conducted in the same manner as described above in connection with the coating of the copper foil in Examples 1 and 2. The thus-applied weight per unit area was likewise 40 g./m². A thus-coated core paper sheet is pressed, together with other paper layers, impregnated with phenolic resin and with a copper foil placed thereon, in the same manner as described in Examples 1 and 2.

EXAMPLE 4

The synthetic resin solution B described in Example 2 is diluted by adding acetone to a viscosity of 200 centipoises. A cellulose paper made of sulfite pulp and having a weight per unit area of 120 g./m² was dipped into this acetone solution and mangled by squeezing rolls so that the dried substrate had a weight per unit area of 240 g./m². A thus-impregnated sheet is pressed, together with core layers impregnated with phenolic resin and after placing a copper foil thereon, into a laminate in the hot press according to the same process as described in Examples 1 and 2.

EXAMPLE 5

The procedure of Example 2 was followed except that a copper foil of a thickness of 70$\mu$ was used in place of a copper foil with a thickness of 35 $\mu$.

EXAMPLE 6

Instead of the solution B of Example 2, a synthetic resin solution C was utilized, consisting of 100 parts by weight of a ketone resin, commercially available as BASF-product Ketonharz A, dissolved in equal parts of methyl-ethyl-ketone (the solution had a viscosity of about 250 cP). The laminate was produced analogously to Example 2.

EXAMPLE 7

Example 2 was repeated using, instead of solution B, a synthetic plastics solution D consisting of 100 parts of cycloaliphatic resin, obtainable commercially under the name Araldite L 580 (Araldite is a registered trademark), 1 part of BF$_3$/amine complex and 20 parts of acetone.

The synthetic plastics solution had a viscosity of from 500 to 600 cP. The copper strip specified in Example 2 and coated with solution D as specified in Example 2 was guided through a drying duct, in which it was heated within 5 minutes increasingly from 100 to 140° C. in order to remove the solvents. After leaving the dryer, the foil had received a polymer coating of 40 g/m². The copper foil thus coated was heated together with eight layers of phenolic resin-impregnated hard paper between pressing plates in a heating press for 70 minutes and at a temperature of 170° C. A coppercovered laminate with a thickness of about 1.6 mm. was formed.

EXAMPLE 8

A laminate which was impregnated with phenolic resin was coated in the manner set out in Example 2 with an aqueous solution of a urea-formaldehyde resin having a solids content of 65-70% by weight (synthetic plastics solution E) such as is often used as impregnated component in the production of phenolic resin laminate. The coating and the drying were carried out in the same manner as described in Example 2 in connection with the coating of the copper foil. The applied weight of solids per unit of surface area was likewise 40 g/m². A laminate coated in this manner was pressed together with other laminates impregnated with phenolic resin and a copper foil in the same way as described in Example 2.

EXAMPLE 9

Synthetic plastics solution D mentioned in Example 7 was diluted by addition of acetone to a viscosity of 200 cP. A cellulose paper formed of sulphited cellulose and having a weight per unit of surface area of 120 g/m² was dipped into this acetone solution and was wrung out between rollers of a wringer to an extent such that the dried substrate had a weight per unit area of 240 g/m². The paper sheet thus impregnated was then pressed together with further such paper sheets coated, however, with phenolic resin, and with application of a copper foil to form a laminate in a heating press, using the procedure set out in Example 2.

EXAMPLE 10

The procedure set out in Example 2 was repeated using a synthetic plastics solution F consisting of a suspension in methanol of 0.7 mol % of neopentyl glycol, 0.3 mol % of ethylene glycol, 1 mol % of fumaric acid and 2% by weight, based on the other constituents, of dibenzoyl peroxide paste. The suspension which was obtained had a solids content of about 70% by weight.

EXAMPLE 11

90 parts by weight (calculated as solid resin) of a 50% by weight dispersion of a butadiene-acrylonitrile resin were mixed with 10 parts by weight (likewise calculated as solid resin) or a phenolic resol resin (solids content about 70%). The dispersion which was obtained was applied as synthetics suspension G in a manner similar to Example 2 to a copper foil having a thickness of 35/µ and was further processed as indicated in Example 2.

To demonstrate and test the desired effect of an improved arc-retardance, two testing electrodes were prepared in accordance with FIGS. 2a and 2b. The comb-shaped electrode (FIG. 2a) and the star-shaped electrode (FIG. 2b) are applied according to the photoprinting method to the laminates of Examples 1–6 and produced according to known processes with etching. Accordingly, a reproduction of several conductor path interruptions is produced. These test electrodes are connected into the horizontal deflection circuit of a color television apparatus according to FIG. 2a and FIG. 2b. When the appliance is turned on, the open-circuit (no-load) voltage which initiates the arc arises at the points of interruption J.

During this test, an evaluation is carried out whether the arc ignites the laminate, because the current flow is constantly maintained due to the formation of graphite bridges, or whether the disturbance cuts itself off. If such cutting off occurs, this proves the effect intended by the present invention, which is due to the fact that the foil conductors are melted at the site of interruption, without the layer disposed therebeneath becoming conductive.

The properties of laminates according to Examples 1–6 determined on the testing electrode with the aid of the horizontal deflection stage are listed in Table 1. The laminate according to Example 1 bursts into flame, during testing with the comb-shaped electrode as well as with the star-shaped electrode. Besides, after the voltage is turned back on, reignition and renewed burning of the test specimen occur. The laminates according to Examples 2–6 show the desired arc-retardance during testing. The electrode is not ignited by the arc; besides, no reignition occurs when the voltage is again turned on. This holds true for the comb-shaped electrode as well as for the star-shaped electrode.

During the manufacture of printed circuits, it is customary to cover parts of the circuit pattern by a heat-resistant lacquer. This so-called "solder masking" lacquer is to prevent the copper foil from being tin-plated over its entire area. Small zones are left unprinted, to solder only the desired soldering junctions for the mounting of the components. To be able to attain the effect of this invention to an optimum extent in the arc-retardant layer of the aforementioned composition, a possibly used solder masking lacquer should also be produced in an arc-retardant form. If customary solder masking lacquers on the basis of phenolic resin epoxy resin, or polyester resin are printed onto the finished circuit board, there is the possibility that these thermosetting resins initiate an ignition and thus a burning of the substrate, although the substrate layer underneath was produced of an arc-retardant material. Consequently, also the solder masking lacquer should be arc-retardant.

EXAMPLE 12

On a substrate laminate produced according to Example 2, a printed circuit is produced in accordance with a conventional process in the form of the comb-shaped or star-shaped electrode. This printed circuit board is then coated, by the well-known screen printing method or by some other conventional coating process, with 40 g./m² of solids content of the synthetic resin solution B disclosed in Example 2. The test results set forth in Table 1 show that also this printed circuit board shows an equally satisfactory ignition characteristic as the circuit boards of Examples 2–6.

TABLE 1

| Example | 1 | 2 | 3 | 4 | 5 | 6 | 12 |
|---|---|---|---|---|---|---|---|
| Synthetic resin solution | A | B | B | B | B | C | B |
| Application method on | copper | copper | paper | paper | copper | copper | circuit board |
| coated | X | X | X | | X | X | X |
| impregnated | | | | X | | | |
| Copper foil, thickness µ | 35 | 35 | 35 | 35 | 70 | 35 | 35 |

TABLE 1-continued

| Example | 1 | 2 | 3 | 4 | 5 | 6 | 12 |
|---|---|---|---|---|---|---|---|
| Behavior under arcing | | | | | | | |
| Ignition in comb electrode | yes | no | no | no | no | no | no |
| Ignition in star electrode | yes | no | no | no | no | no | no |
| Reignition when turned back on | yes | no | no | no | no | no | no |
| *Adhesive strength 20° C. kp/25mm. | 4.5 | 4.6 | 4.7 | 4.5 | 4.9 | 1.1 | not applicable |
| *Resistance against NaOH | OK | OK | OK | OK | OK | OK | OK |

Further information see American Standards ANSI-NEMA Li-1/10 copper-clad laminates.

TABLE 2

| Example | 7 | 8 | 9 | 10 | 11 |
|---|---|---|---|---|---|
| Synthetic plastics solution | D | E | D | F | G |
| Application method on | copper | paper | paper | copper | copper |
| Coated | x | x | | x | x |
| Impregnated | | | x | | |
| Copper foil thickness ($\mu$m) | 35 | 35 | 35 | 35 | 35 |
| Behaviour on arcing | | | | | |
| (a) Ignition with comb Electrode | no | no | no | no | no |
| (b) Ignition with star electrode | no | no | no | no | no |
| Re-ignition on subsequent switching-on | no | no | no | no | no |

The accompanying FIG. 1 shows the circuit diagram, in principle, of a horizontal deflection stage in a color television apparatus with thyristor control. FIGS. 2a and 2b show a testing device and test electrodes, i.e. comb-shaped electrode and star-shaped electrode, respectively, for arc-retardant tests. In the figures, the individual letters designate the following elements:

A designates an operating voltage; (ca. 1800 Volt, when D is a tube)
B designates a booster capacitor;
C designates a booster diode;
E designates an oscillator (15625 Hz);
F designates a fly-back transformer;
G designates a deflection coil;
H designates a picture tube;
J designates a site of interruption with arc; gap of between 25 and 100/$\mu$m (1 to 4 mils)
K designates a comb-shaped electrode; and
L designates a star-shaped electrode.
D horizontal output amplification (tube or semiconductor)

Secondary winding of the transformer is a saw-tooth-no-load-voltage with a maximum amplitude between 2000 and 3000 Volts as usual in color TV-horizontal outputs.

What is claimed is:

1. A laminated material comprising a substrate material containing resin-impregnated layers, and an electrically conductive metal foil having a thickness between 5 and 100$\mu$ disposed on said substrate and an arc-retardant layer having a high insulation resistance of more than $10^{12}$ ohms arranged between the metal foil and the substrate material, and said layer having a thickness of from 20 to 300$\mu$ and consisting essentially of from about 60 to about 100% by weight of a heat-stable cross-linked acrylic resin or ketone resin which is free of aromatic groupings or heterocyclic rings containing at least one hetero-atom and conjugated double bonds and which is not converted to a graphite-containing structure upon being thermally decomposed and up to 30% by weight of an epoxy resin, a phenolic resin or a melamine resin.

2. The laminated material of claim 1, wherein the said metal foil is made of aluminum, silver, tin or copper.

3. The laminated material of claim 1, wherein said layer contains acrylonitrile in amounts of 20–70% by weight, acrylic acid ester in amounts between 20–70% by weight, and a phenol-resol resin or an epoxy resin on the basis of bisphenol A in amounts of 15–20% by weight.

4. The laminated material of claim 3, wherein the acrylic acid ester is the methyl ester or the ethyl ester of acrylic acid.

5. The laminated material of claim 1 wherein said layer contains the ketone resin in amounts of between 70 and 90% by weight and epoxy resin on the basis of bisphenol A and/or phenol-resol resin in an amount of between 10 and 20% by weight.

6. The laminated material of claim 1, wherein the metal foil is made of copper.

7. The laminated material of claim 1, wherein said acrylic resin is a polyacrylonitrile, polymethacrylonitrile, or a polyalkylacrylate and the ketone resin is a resin produced by alkaline condensation of aliphatic and/or cycloaliphatic ketones with formaldehyde.

8. A printed circuit which comprises the laminated material of claim 1, wherein the foil is printed to form a conductor.

9. The laminated material of claim 1, wherein the arc-retardant layer is absorbed in a reinforcing material of the uppermost laminate layer of the substrate material and in contact with the metal foil.

* * * * *